(12) United States Patent
Cheng et al.

(10) Patent No.: US 9,287,375 B2
(45) Date of Patent: Mar. 15, 2016

(54) TRANSISTOR DEVICE AND RELATED MANUFACTURING METHOD

(71) Applicant: Semiconductor Manufacturing International (Shanghai) Corporation, Shanghai (CN)

(72) Inventors: Yong Cheng, Shanghai (CN); Hui Fang Song, Shanghai (CN); Qian Cheng Ma, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/464,107

(22) Filed: Aug. 20, 2014

(65) Prior Publication Data

US 2015/0318365 A1 Nov. 5, 2015

(30) Foreign Application Priority Data

May 5, 2014 (CN) .......................... 2014 1 0186554

(51) Int. Cl.
| | |
|---|---|
| H01L 29/00 | (2006.01) |
| H01L 29/423 | (2006.01) |
| H01L 29/78 | (2006.01) |
| H01L 21/28 | (2006.01) |
| H01L 29/417 | (2006.01) |
| H01L 29/66 | (2006.01) |

(52) U.S. Cl.
CPC ...... *H01L 29/4236* (2013.01); *H01L 21/28114* (2013.01); *H01L 29/00* (2013.01); *H01L 29/41766* (2013.01); *H01L 29/66621* (2013.01); *H01L 29/78* (2013.01); *H01L 29/7825* (2013.01)

(58) Field of Classification Search
CPC .................. H01L 29/4236; H01L 29/41766; H01L 29/66621; H01L 29/7825
USPC ................................................. 257/329, 330
See application file for complete search history.

(56) References Cited

U.S. PATENT DOCUMENTS

| | | | | |
|---|---|---|---|---|
| 2011/0156136 | A1* | 6/2011 | Amari | 257/330 |
| 2015/0108570 | A1* | 4/2015 | Kawahara et al. | 257/334 |
| 2015/0155355 | A1* | 6/2015 | Losee et al. | 257/77 |
| 2015/0155379 | A1* | 6/2015 | Kumar et al. | 257/330 |

FOREIGN PATENT DOCUMENTS

| | | |
|---|---|---|
| CN | 101657901 A | 2/2010 |
| CN | 103021858 A | 4/2013 |

* cited by examiner

*Primary Examiner* — Ngan Ngo
(74) *Attorney, Agent, or Firm* — Innovation Counsel LLP

(57) ABSTRACT

A transistor device may include a substrate that has a recess and a substrate surface, wherein the recess is recessed with respect to the substrate surface. The transistor device may further include a source and a drain that overlap the substrate. The transistor device may further include a gate structure that has a first gate structure portion and a second gate structure portion, wherein the first gate structure portion is positioned inside the recess, and wherein the second gate structure portion is connected to the first gate structure and is positioned outside the first recess.

10 Claims, 10 Drawing Sheets

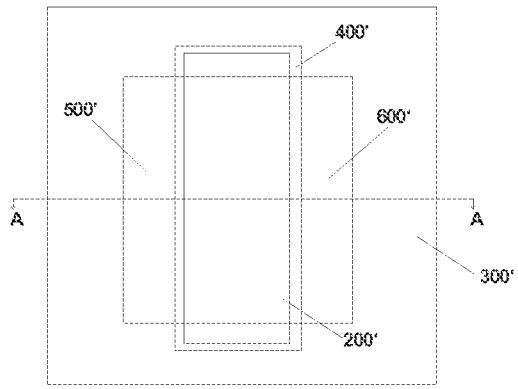
FIG. 1-A (Prior Art)
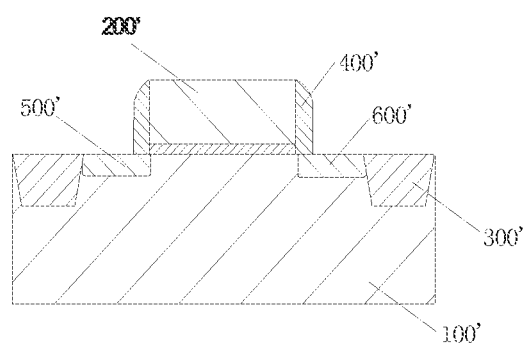
FIG. 1-B (Prior Art)
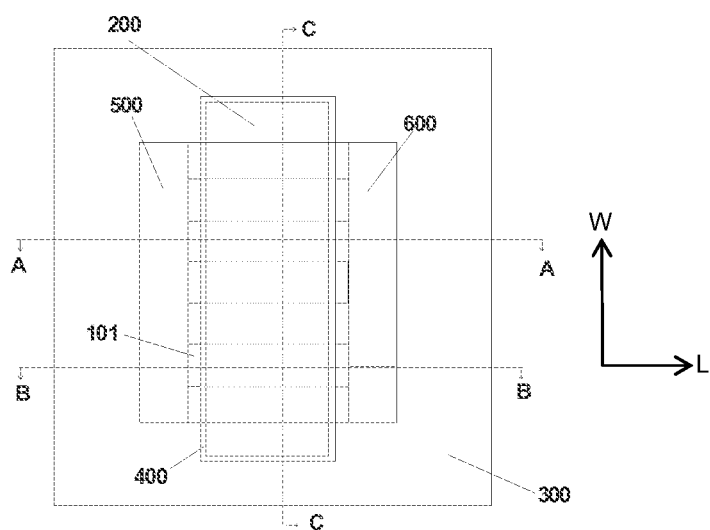
FIG. 2-A

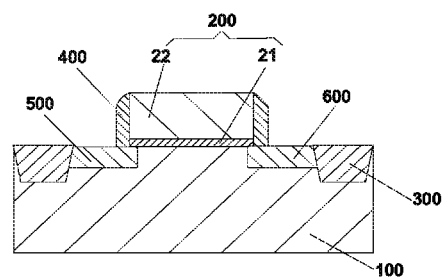
FIG. 2-B
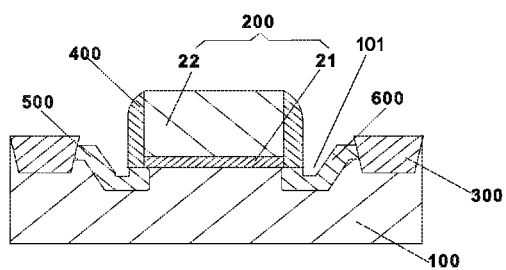
FIG. 2-C
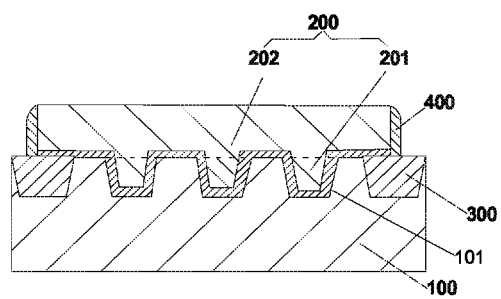
FIG. 2-D

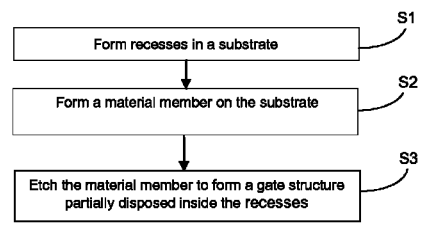
FIG. 3
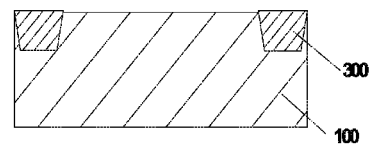
FIG. 4-A
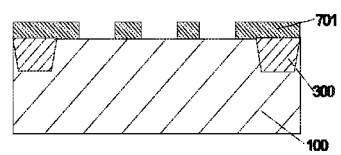
FIG. 4-B
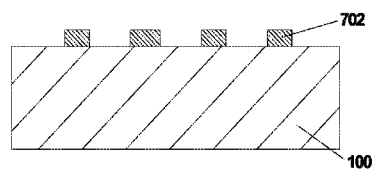
FIG. 4-C

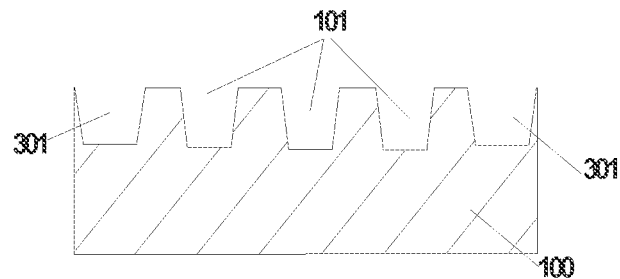
FIG. 4-D
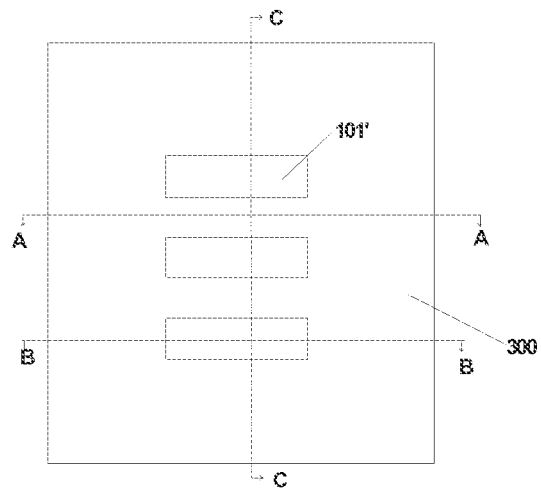
FIG. 4-E
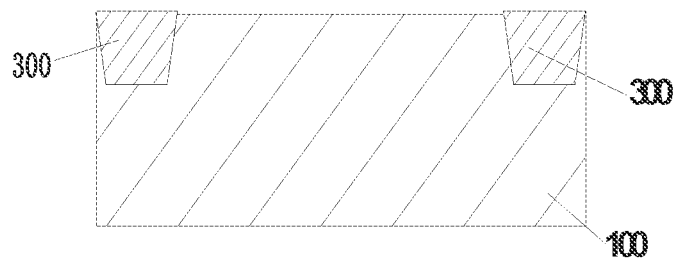
FIG. 4-F

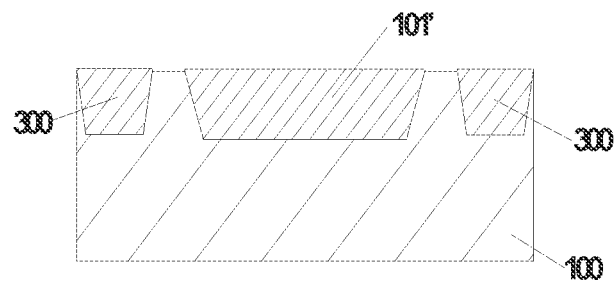
FIG. 4-G
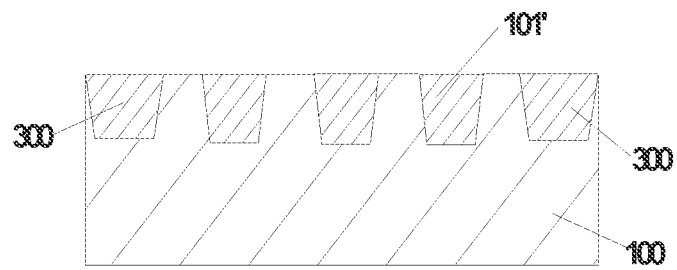
FIG. 4-H
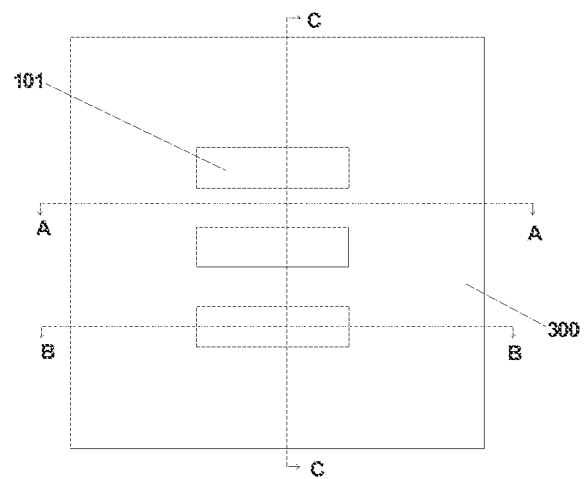
FIG. 5-A

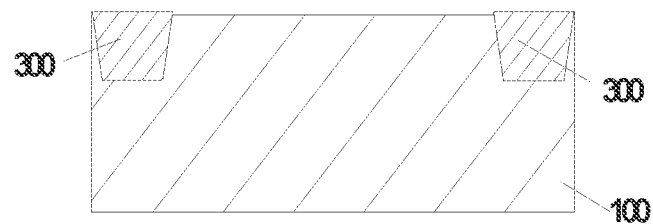
FIG. 5-B
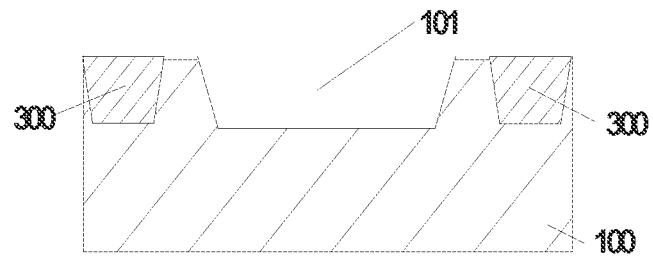
FIG. 5-C
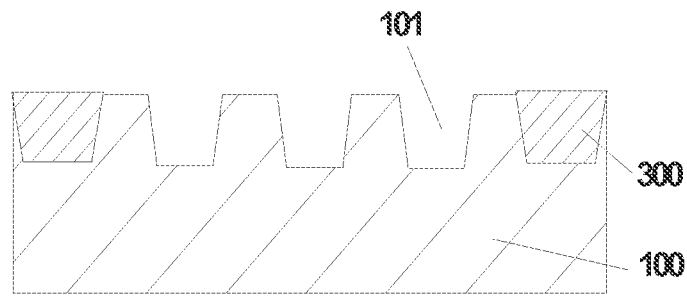
FIG. 5-D

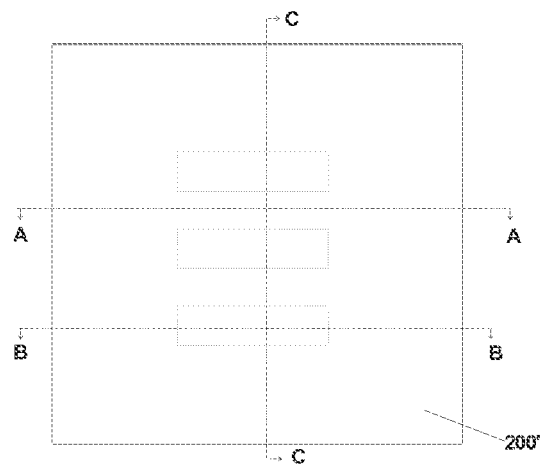
FIG. 6-A
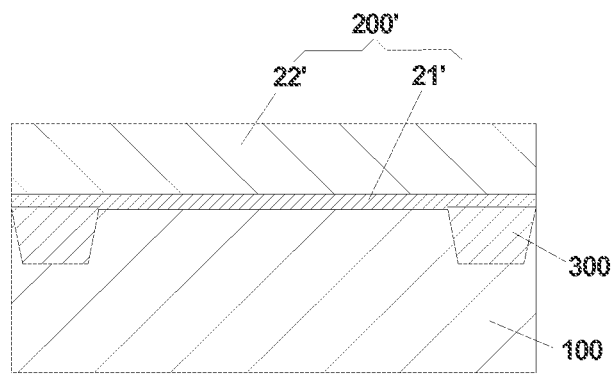
FIG. 6-B
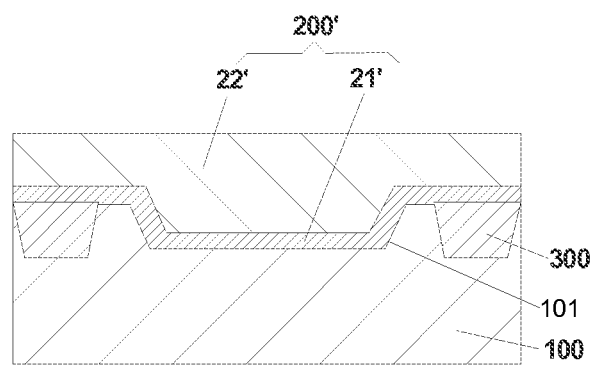
FIG. 6-C

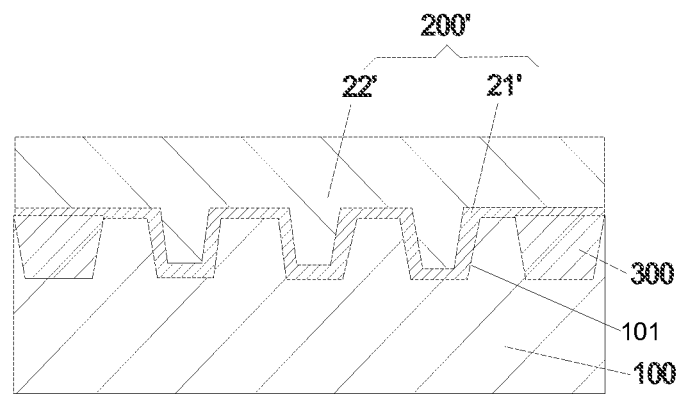
FIG. 6-D
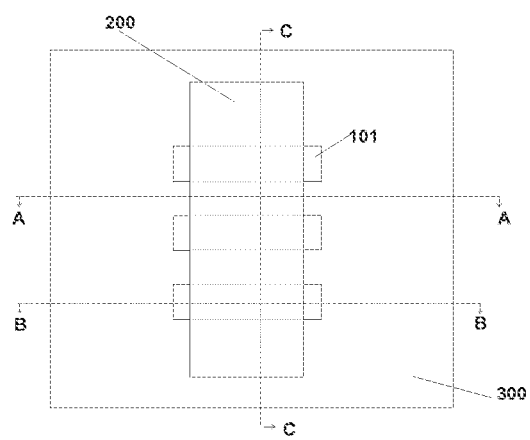
FIG. 7-A
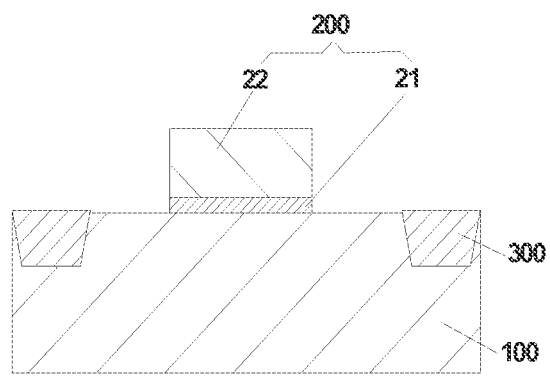
FIG. 7-B

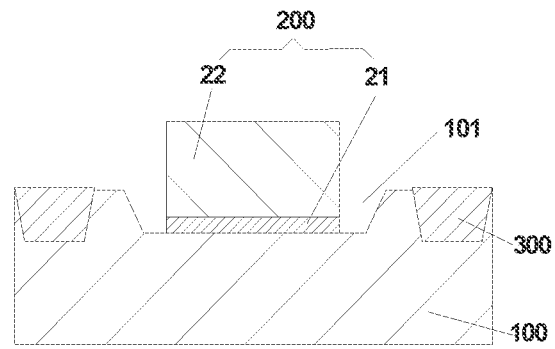
FIG. 7-C
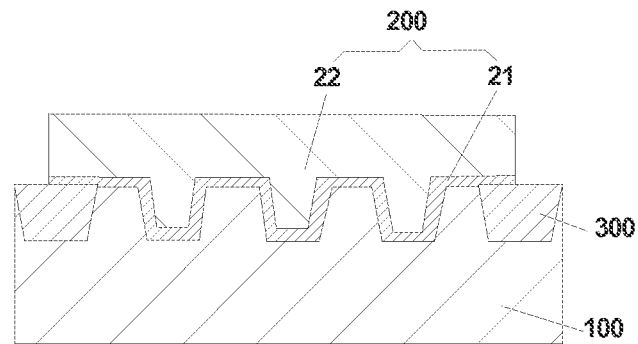
FIG. 7-D
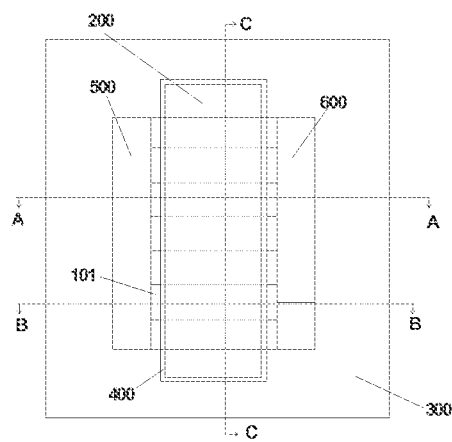
FIG. 8-A

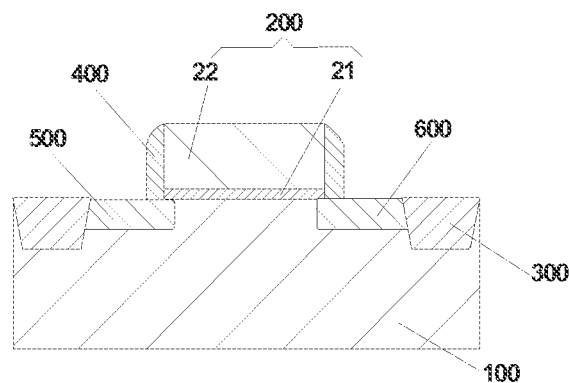
FIG. 8-B
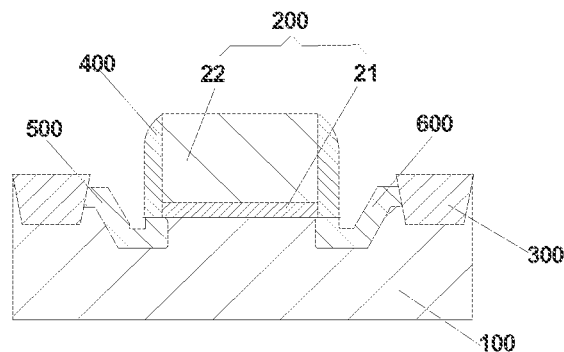
FIG. 8-C
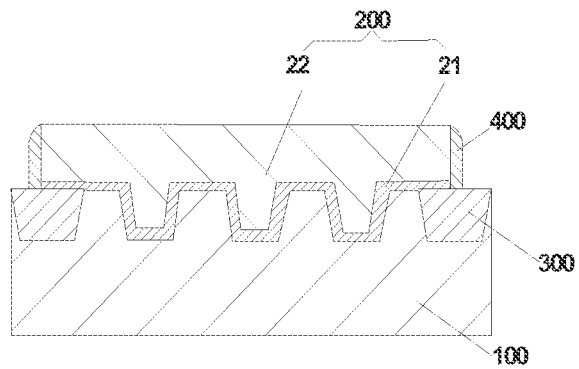
FIG. 8-D

TRANSISTOR DEVICE AND RELATED MANUFACTURING METHOD

CROSS-REFERENCE TO RELATED APPLICATION

This application claims priority to and benefit of Chinese Patent Application No. 201410186554.5, filed on 5 May 2014, the Chinese Patent Application being incorporated herein by reference in its entirety.

BACKGROUND OF THE INVENTION

The present invention is related to a semiconductor device. In particular, the present invention is related to a transistor device and a method for manufacturing the transistor device.

A transistor, such as a metal-oxide-semiconductor (MOS) transistor, may be utilized in a power management integrated circuit (IC). For maximizing processing speed and minimizing energy consumption per switch event to optimize the performance of the power management IC, the MOS transistor may require a large current and a low on-state resistance (Ron). Reduction of Ron may enable increase of the number of MOS switches in a given time period.

FIG. 1A and FIG. 1B show a schematic plan view and a schematic cross-sectional view that illustrate a MOS transistor device. The MOS transistor may include a substrate 100'. The MOS transistor may include a gate structure 200', shallow trench isolation (STI) structure 300', a source 500', and a drain 600', disposed on the substrate 100'. The MOS transistor may include sidewalls 400' disposed on lateral sides of the gate structure 200'. For minimizing Ron, the channel width of the MOS transistor may be configured substantially large. Nevertheless, the large channel width may result in an undesirably low computing power per unit area, an undesirably large size, and/or an undesirably high manufacturing of the MOS transistor. Some alternative MOS transistor configurations for minimizing Ron may be associated with substantially complicated structures, substantially high costs, and/or other undesirable effects.

SUMMARY

An embodiment of the present invention may be related to a transistor device that may include a substrate that has a first recess and a first substrate surface, wherein the first recess is recessed with respect to the first substrate surface. The transistor device may further include a source and a drain that overlap the substrate. The transistor device may further include a gate structure that includes a semiconductor member and/or a conductor member and has a first gate structure portion and a second gate structure portion, wherein the first gate structure portion is positioned inside the first recess, and wherein the second gate structure portion is (directly) connected to the first gate structure and is positioned outside the first recess. The first gate structure portion and the second gate structure portion may be form of a same material.

The second gate structure portion may overlap (and may directly contact) the first substrate surface.

The first recess may have a first length in a first direction that is consistent with and/or parallel to a movement (e.g., electron or hole flow) from the source to the drain. The first recess may have a second length in a second direction that is perpendicular to the first direction, and wherein the first length is larger than the second length.

A length of the gate structure in the first direction may be less than or equal to the first length.

The substrate further may have a second recess that is recessed with respect to the first substrate surface. The gate structure further may have a third gate structure portion that is positioned inside the second recess. The first substrate surface may be positioned between the first recess and the second recess in a plan view of the transistor device in a direction perpendicular to a distance direction that corresponds to a distance between the source and the drain. The distance direction may be consistent with and/or parallel to a movement (e.g., electron or hole flow) from the source to the drain.

A depth of the first recess with respect to the first substrate surface may be in a range of 10% to 50% of a thickness of the substrate with respect to the first substrate surface.

The gate structure may include an oxide member and a polysilicon member. The polysilicon member may include a polysilicon portion that is positioned inside the first recess. The oxide member may be positioned between the substrate and the polysilicon member.

The oxide member has a first oxide portion and a second oxide portion. The first oxide portion may extend not coplanar with the second oxide portion. For example, the first oxide portion may extend at an obtuse, right, or acute angle with respect to the second oxide portion. Both the first oxide portion and the second oxide portion may be positioned inside the first recess and may contact the polysilicon portion.

The transistor device may include an isolation member formed of an insulating material. The substrate may have a trench. The isolation member may be positioned inside the trench. The first recess may be positioned between two portions of the isolation member in a cross-sectional view of the transistor device.

A portion of the source and a portion of the drain may be positioned inside the first recess.

An embodiment of the invention may be related to a method for manufacturing a transistor device. The method may include the following steps: forming a first recess in a substrate such that the first recess is recessed with respect to a surface of the substrate; providing a gate structure material member such that the gate structure material member is partially positioned inside the first recess and partially positioned outside the first recess; and etching the gate structure material member to form a gate structure that has a first gate structure portion and a second gate structure portion. The first gate structure portion may be positioned inside the first recess. The second gate structure portion may be (directly) connected to the first gate structure portion and may be positioned outside the first recess.

The gate structure material member may include an oxide member and a polysilicon member. The polysilicon member may include a polysilicon portion that is positioned inside the first recess. The oxide member may be positioned between the substrate and the polysilicon member.

The oxide member may have a first oxide portion and a second oxide portion. The first oxide portion may extend not coplanar with the second oxide portion. Both the first oxide portion and the second oxide portion may be positioned inside the first recess and may contact the polysilicon portion.

The method may include the following steps: forming a mask on the surface of the substrate. The mask has a first opening that exposes a first exposed portion of the substrate; and etching the first exposed portion of the substrate for producing the first recess. A length of the first opening in a first direction may be larger than a length of the gate structure in the first direction.

The substrate may have a trench before the first recess is formed. An isolation member formed of an insulating material may be positioned inside the trench before the first recess is formed. The mask may overlap the isolation member when the mask is formed. The first recess may be formed such that the first recess is positioned between two portions of the isolation member in a cross-sectional view of the substrate.

The mask may have a second opening that exposes a second exposed portion of the substrate. The method may include the following steps: etching the second exposed portion of the substrate for forming a trench when etching the first exposed portion of the substrate; in a same process step, providing a first portion of an insulating material in the first recess and providing a second portion of the insulating material in the trench; and removing the first portion of the insulating material from the first recess.

The length of the first opening in the first direction may be larger than a length of the first opening in a second direction that is perpendicular to the first direction.

The mask may have a second opening that exposes a second exposed portion of the substrate. The mask may have a mask portion positioned between the first opening and the second opening in a second direction that is perpendicular to the first direction. The second exposed portion of the substrate is etched such that a second recess is formed when the first recess is formed. A portion of the gate structure material member may be positioned inside the second recess when the gate structure material member is formed.

A depth of the first recess with respect to the surface of the substrate may be in a range of 10% to 50% of a thickness of the substrate with respect to the surface of the substrate.

The method may include using at least the gate structure as a mask in a process step that includes providing a first portion of a conductive material into a first portion of the first recess and includes providing a second portion of the conductive material into a second portion of the first recess. The first portion of the first recess may be positioned at a first side of the gate structure. The second portion of the first recess may be positioned at a second side of the gate structure opposite the first side of the gate structure. The first portion of the conductive material may be a portion of a source of the transistor device. The second portion of the conductive material may be a portion of a drain of the transistor device.

According to embodiments of the invention, in a transistor device, a gate structure may be partially disposed inside one or more recesses of a substrate, such that sides of the one or more recesses may practically maximize an effective channel width of the transistor device. Advantageously, an on-state resistance (Ron) of the transistor device may be minimized, and performance of the transistor device may be optimized.

According to embodiments of the invention, the one or more recesses may not substantially complicate the structure or manufacturing of the transistor device, and the one or more recesses may not cause significant undesirable effects on the performance of the transistor device. Advantageously, the transistor device may have satisfactory performance characteristics without incurring an undesirably high cost or significant side effects.

The above summary is related to one or more of many embodiments of the invention disclosed herein and is not intended to limit the scope of the invention.

BRIEF DESCRIPTION OF THE DRAWINGS

FIG. 1A shows a schematic plan view (e.g., top view) that illustrates a MOS transistor device.
FIG. 1B shows a schematic cross-sectional view taken at a line A-A indicated in FIG. 1A.

FIG. 2A shows a schematic plan view (e.g., top view) that illustrates a transistor device (e.g., a MOS transistor device) in accordance with an embodiment of the present invention.
FIG. 2B shows a schematic cross-sectional view taken at a line A-A indicated in FIG. 2A in accordance with an embodiment of the present invention.
FIG. 2C shows a schematic cross-sectional view taken at a line B-B indicated in FIG. 2A in accordance with an embodiment of the present invention.
FIG. 2D shows a schematic cross-sectional view taken at a line C-C indicated in FIG. 2A in accordance with an embodiment of the present invention.
FIG. 3 shows a flowchart that illustrates a method for manufacturing a transistor device (e.g., a MOS transistor device) in accordance with an embodiment of the present invention.
FIGS. 4A to 8D show schematic views that illustrate structures formed during transistor device manufacturing in accordance with embodiments of the present invention.
FIG. 4A shows a schematic cross-sectional view illustrating a structure that includes a substrate and a shallow trench isolation (STI) structure in accordance with an embodiment of the present invention.
FIG. 4B shows a schematic cross-sectional view illustrating a structure that includes a first photoresist mask formed on the substrate in accordance with an embodiment of the present invention.
FIG. 4C shows a schematic cross-sectional view illustrating a structure that includes a second photoresist mask formed on the substrate in accordance with an embodiment of the present invention.
FIG. 4D shows a schematic cross-sectional view illustrating a structure that includes a shallow trench and one or more recesses in the substrate resulted from etching using the second photoresist mask in accordance with an embodiment of the present invention.
FIG. 4E shows a schematic plan view (e.g., top view) illustrating a structure that includes a shallow trench isolation (STI) structure and one or more filled recesses resulted from filling the shallow trenches and the one or more recesses in accordance with an embodiment of the present invention.
FIG. 4F shows a schematic cross-sectional view taken at a line A-A indicated in FIG. 4E in accordance with an embodiment of the present invention.
FIG. 4G shows a schematic cross-sectional view taken at a line B-B indicated in FIG. 4E in accordance with an embodiment of the present invention.
FIG. 4H shows a schematic cross-sectional view taken at a line C-C indicated in FIG. 4E in accordance with an embodiment of the present invention.
FIG. 5A shows a schematic plan view (e.g., top view) illustrating a structure that includes one or more recesses in the substrate in accordance with an embodiment of the present invention.
FIG. 5B shows a schematic cross-sectional view taken at a line A-A indicated in FIG. 5A in accordance with an embodiment of the present invention.
FIG. 5C shows a schematic cross-sectional view taken at a line B-B indicated in FIG. 5A in accordance with an embodiment of the present invention.
FIG. 5D shows a schematic cross-sectional view taken at a line C-C indicated in FIG. 5A in accordance with an embodiment of the present invention.
FIG. 6A shows schematic plan view (e.g., top view) illustrating a structure that includes a gate structure material member formed on a recessed substrate (e.g., the substrate illustrated in FIGS. 5A to 5D) in accordance with an embodiment of the present invention.

FIG. 6B shows a schematic cross-sectional view taken at a line A-A indicated in FIG. 6A in accordance with an embodiment of the present invention.

FIG. 6C shows a schematic cross-sectional view taken at a line B-B indicated in FIG. 6A in accordance with an embodiment of the present invention.

FIG. 6D shows a schematic cross-sectional view taken at a line C-C indicated in FIG. 6A in accordance with an embodiment of the present invention.

FIG. 7A shows schematic plan view (e.g., top view) illustrating a structure that includes a gate structure resulted from etching a gate structure material member (e.g., the gate structure material member illustrated in FIGS. 6A to 6D) in accordance with an embodiment of the present invention.

FIG. 7B shows a schematic cross-sectional view taken at a line A-A indicated in FIG. 7A in accordance with an embodiment of the present invention.

FIG. 7C shows a schematic cross-sectional view taken at a line B-B indicated in FIG. 7A in accordance with an embodiment of the present invention.

FIG. 7D shows a schematic cross-sectional view taken at a line C-C indicated in FIG. 7A in accordance with an embodiment of the present invention.

FIG. 8A shows schematic plan view (e.g., top view) illustrating a transistor device structure (e.g., including the gate structure illustrated in FIGS. 7A to 7D) in accordance with an embodiment of the present invention.

FIG. 8B shows a schematic cross-sectional view taken at a line A-A indicated in FIG. 8A in accordance with an embodiment of the present invention.

FIG. 8C shows a schematic cross-sectional view taken at a line B-B indicated in FIG. 8A in accordance with an embodiment of the present invention.

FIG. 8D shows a schematic cross-sectional view taken at a line C-C indicated in FIG. 8A in accordance with an embodiment of the present invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well-known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "conduct" may mean "electrically conduct". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 2A shows a schematic plan view (or top view) that illustrates a transistor device (e.g., a MOS transistor device) in accordance with an embodiment of the present invention. FIG. 2B shows a schematic cross-sectional view taken at a line A-A indicated in FIG. 2A in accordance with an embodiment of the present invention. FIG. 2C shows a schematic cross-sectional view taken at a line B-B indicated in FIG. 2A in accordance with an embodiment of the present invention. FIG. 2D shows a schematic cross-sectional view taken at a line C-C indicated in FIG. 2A in accordance with an embodiment of the present invention.

The transistor device (or transistor, for conciseness) may include a substrate 100. The transistor device may include shallow trench isolation (STI) structure 300, a source electrode 500 (or source 500), a drain electrode 600 (or drain 600) a gate electrode structure 200 (or gate structure 200) each overlapping the substrate 100. The transistor device may include sidewalls 400 disposed on lateral sides of the gate structure 200. The gate structure 200, the sidewalls 400, the source 500, and the drain 600 are disposed in an active region defined by the STI structure 300.

A channel length of the transistor device may be a distance between the source 500 and the drain 600. A channel width of the transistor device may be a width associated with a channel region between the source 500 and the drain 600 in a direction substantially perpendicular to the channel length. A channel length direction L is a direction that is consistent with and/or parallel to the channel length and/or is consistent with and/or parallel to a movement from the source 500 to (or toward) the drain 600. A channel width direction is a direction substantially perpendicular to the channel length direction L.

The substrate 100 may include one or more recess structures 101 (or recesses 101). The gate structure 200 may include one or more first-type gate portions 201 (or first gate portions 201) and a second-type gate portion 201 (or second gate portion 202). Each first gate portion 201 may be disposed inside a recess 101. The second gate portion 202 may be (directly) connected to the first gate portion(s) 201, disposed outside the one or more recesses 101, overlapping the first gate portion(s) 201 and the substrate 100 in a direction perpendicular to the substrate 100, and exposed over the substrate 100. One or more portions of the source 500, one or more portions of the drain 600, and one or more portions of the sidewalls 400 may be positioned inside one or more recesses 101.

Dimensions of one or more recesses 101 may be configured to avoid potential undesirable effects that may be caused by partial removal of the substrate 100. The overlapping surfaces of one or more first gate portions 201 and one or more recesses 101 may virtually and/or practically maximize an effective channel width of the transistor device in substantially the channel width direction W. The sidewalls of recesses 101 may enable the transistor device to have an effective channel width that is larger than the channel width of a conventional transistor device of a comparable size. Advantageously, the Ron of the transistor device may be minimized.

An opening of a recess 101 may have a first length in the channel length direction L and may have a second length in the channel width direction W. The second length may be substantially small, e.g., smaller than the first length, such that the number (quantity) of recesses 101 may be maximized for practically maximizing a channel width of the transistor device.

The substrate 100 may have a plurality of recesses 100 arranged along the channel width direction W. A distance between a bottom edge of each recess 100 and an opening edge of the recess 100 may practically contribute to an effective channel width of the transistor device.

The number (or quantity) and dimensions (e.g., depths) of the recesses 101 may be configured to determine the Ron of the transistor device. A depth of a recess 101 may be in a range of 10% to 50% of a thickness of the substrate 100, wherein the thickness of the substrate 100 may be the maximum thickness of the substrate 100 in a direction perpendicular to both the channel length direction L and the channel width direction W.

For preventing generation of excessive overcurrent between the source 500 or drain 600 and the gate structure 200, which may undesirably cause current increase in the transistor device, a length of the gate structure 200 in the channel length direction L may be less than or equal to the first length.

The gate structure 200 may include a gate oxide layer 21 and a polycrystalline silicon layer 22 (or polysilicon layer 22). The gate oxide layer 21 may be positioned between and separate the polysilicon layer 22 and the substrate 100.

FIG. 3 shows a flowchart that illustrates a method for manufacturing a transistor device (e.g., a MOS transistor device) in accordance with an embodiment of the present invention.

The method may include the following steps: step S1, forming one or more recesses 101 in a substrate 100; step S2, forming a gate structure material member on the substrate 100 (which includes the one or more recesses 101); and step S3, etching the gate structure material member to form a gate structure 200. The gate structure 200 may include one or more first-type portions 201 (or first portions 201) that are positioned inside the one or more recesses 101. The gate structure 200 may further include a second-type portion 201 (or second portion 202) that is connected to the one or more first portions 201, overlaps the one or more first portions 201 and the substrate 100, and is disposed outside the one or more recesses 101.

According to embodiments of the invention, sides of the one or more recesses 101 may practically maximize an effective channel width of the transistor device. Advantageously, an on-state resistance (Ron) of the transistor device may be minimized, and performance of the transistor device may be optimized. The one or more recesses 101 may not substantially complicate the structure or manufacturing of the transistor device. The one or more recesses 101 may not cause significant undesirable effects on the performance of the transistor device.

An embodiment related to the step S1 (forming one or more recesses 101 in a substrate 100) is discussed with reference to FIGS. 4A, 4B, etc. FIG. 4A shows a schematic cross-sectional view illustrating a structure that includes a substrate 100 and a shallow trench isolation (STI) structure 300 in accordance with an embodiment of the present invention. The step S1 may include the following step: preparing the structure illustrated in FIG. 4A. The STI structure 300 may be formed in the substrate 100 using one or more methods (e.g., one or more of etching, filling, and polishing) known in the art and may define an active region.

FIG. 4B shows a schematic cross-sectional view illustrating a structure that includes a first (or first-type) photoresist mask 701 formed on the substrate 100 in accordance with an embodiment of the present invention. The step S1 may include the following steps: providing a photoresist on the structure illustrated in FIG. 4A; and patterning the photoresist to form the first photoresist mask 701. The photoresist mask 701 may have one or more openings disposed at the active region.

FIG. 5A shows a schematic plan view (or top view) illustrating a structure that includes one or more recesses 101 in the substrate in accordance with an embodiment of the present invention. FIG. 5B shows a schematic cross-sectional view taken at a line A-A indicated in FIG. 5A in accordance with an embodiment of the present invention. FIG. 5C shows a schematic cross-sectional view taken at a line B-B indicated in FIG. 5A in accordance with an embodiment of the present invention. FIG. 5D shows a schematic cross-sectional view taken at a line C-C indicated in FIG. 5A in accordance with an embodiment of the present invention.

The step S1 may include the following step: etching the structure illustrated in FIG. 4B using a wet etching method and/or a dry etching method. The substrate 100 may be partially protected by the first photoresist mask 701. Portions of the substrate 100 exposed by the first photoresist mask 701 may be removed, such that the recesses 101 may be formed. In an embodiment, an anisotropic dry etching method may be used for forming the recesses 101. As a result, the recesses 101 may have substantially smooth surfaces, such that first portions 201 of the gate structure 200 subsequently formed in the recesses 101 may also have substantially smooth surfaces. Advantageously, the quality and performance of the formed transistor device may be optimized.

According to embodiments of the invention, such as those discussed with reference to FIGS. 4A, 4B, etc., the shallow trench for forming the STI structure 300 and the recesses 101 may be formed in separate etching processes. Advantageously, dimensions of the STI structures 300 and the recesses 101 may be flexibly configured, and various transistor device specifications may be substantially satisfied.

An embodiment related to the step S1 is discussed with reference to FIGS. 4C to 4H, etc. FIG. 4C shows a schematic cross-sectional view illustrating a structure that includes a second (or second-type) photoresist mask 702 formed on a substrate 101 in accordance with an embodiment of the present invention. The step S1 may include the following steps: providing a photoresist on the substrate 101; and patterning the photoresist to form the second photoresist mask 702. The second photoresist 702 may have a first (first-type) opening that corresponds to a position designated for forming a STI structure 300 and may have one or more second (second-type) openings that correspond to one or more positions designated for forming one or more recesses 101.

FIG. 4D shows a schematic cross-sectional view illustrating a structure that includes a shallow trench 301 and one or more recesses 101 in the substrate 100 resulted from etching using the second photoresist mask 702 in accordance with an embodiment of the present invention. The step S1 may include the following step: etching the structure illustrated in FIG. 4C using a wet etching method and/or a drying etching method (e.g., an anisotropic dry etching method) to remove portions of the substrate 100 that are exposed by the second photoresist 702, such that the shallow trench 301 and the one or more recesses 101 may be formed. The shallow trench 301 may define (e.g., surround and/or boarder) an active region. The one or more recesses 101 may be positioned at the active region and may correspond to a position where a gate structure 200 is to be formed.

FIG. 4E shows a schematic plan view (or top view) illustrating a structure that includes a shallow trench isolation (STI) structure 300 and one or more filled recesses 101' resulted from filling the shallow trenches 301 and the one or more recesses 101 in the structure illustrated in FIG. 4D in accordance with an embodiment of the present invention. FIG. 4F shows a schematic cross-sectional view taken at a line A-A indicated in FIG. 4E in accordance with an embodiment of the present invention. FIG. 4G shows a schematic cross-sectional view taken at a line B-B indicated in FIG. 4E in accordance with an embodiment of the present invention. FIG. 4H shows a schematic cross-sectional view taken at a line C-C indicated in FIG. 4E in accordance with an embodiment of the present invention.

The step S1 may include the following steps: providing (e.g., filling) an isolation material (e.g., an insulating material) in the shallow trench 301 and the one or more recesses 101 illustrated in FIG. 4D; performing chemical-mechanical polishing (CMP) on the filled isolation material, such that the structure illustrated in FIGS. 4E to 4H may be formed, wherein the STI structure 300 may include a first portion of the isolation material and that the one or more filled recesses 101' may include a second portion of the isolation material; and removing (e.g., through etching) the second portion of the isolation material (which was filled in the one or more filled recessed 101') to obtain (or reveal) the one or more recesses 101, such that the structure illustrated in FIGS. 5A to 5D may be formed.

In an embodiment, a second opening of the second photoresist mask 702 may have a first length in the channel length direction L and may have a second length in the channel width direction W. The second length may be substantially small, e.g., smaller than the first length, such that the number (quantity) of recesses 101 may be maximized for practically maximizing a channel width of the transistor device.

The second photoresist mask 702 may have a plurality of second openings arranged along the channel width direction W. A distance between a bottom edge of each resulted recess 100 and an opening edge of the recess 100 may practically contribute to an effective channel width of the transistor device.

The number (or quantity) and dimensions (e.g., depths) of the recesses 101 may be configured to determine the Ron of the transistor device. A depth of a recess 101 may be in a range of 10% to 50% of a thickness of the substrate 100, wherein the thickness of the substrate 100 may be the maximum thickness of the substrate 100 in a direction perpendicular to both the channel length direction L and the channel width direction W.

An embodiment related to the step S2 (forming a gate structure material member on the substrate 100 with one or more recesses 101) is discussed with reference to FIGS. 6A to 6D. FIG. 6A shows schematic plan view (or top view) illustrating a structure that includes a gate structure material member 200' formed on a recessed substrate (e.g., the structure illustrated in FIGS. 5A to 5D) in accordance with an embodiment of the present invention. FIG. 6B shows a schematic cross-sectional view taken at a line A-A indicated in FIG. 6A in accordance with an embodiment of the present invention. FIG. 6C shows a schematic cross-sectional view taken at a line B-B indicated in FIG. 6A in accordance with an embodiment of the present invention. FIG. 6D shows a schematic cross-sectional view taken at a line C-C indicated in FIG. 6A in accordance with an embodiment of the present invention.

The step S2 may include the following step: forming (e.g., through deposition, oxidation, and/or growth) an oxide layer 21' on the structure illustrated in FIGS. 5A to 5D, which may include the substrate 100 with a STI structure 300 and one or more recesses 101; and subsequently forming (e.g., through deposition) a polysilicon layer 22' on the oxide layer 21', such that the combination of the oxide layer 21' and the polysilicon layer 22' may form a gate structure material member 200' illustrated in FIGS. 6A to 6D. As can be appreciated from FIGS. 6A to 6D, one or more portions of the gate structure material member 200' may be disposed inside one or more recesses 101.

An embodiment related to the step S3 (etching the gate structure material member 200' to form a gate structure 200) is discussed with reference to FIGS. 7A to 7D. FIG. 7A shows schematic plan view (or top view) illustrating a structure that includes a gate structure 200 resulted from etching a gate structure material member (e.g., the gate structure material member 200' illustrated in FIGS. 6A to 6D) in accordance with an embodiment of the present invention. FIG. 7B shows a schematic cross-sectional view taken at a line A-A indicated in FIG. 7A in accordance with an embodiment of the present invention. FIG. 7C shows a schematic cross-sectional view taken at a line B-B indicated in FIG. 7A in accordance with an embodiment of the present invention. FIG. 7D shows a schematic cross-sectional view taken at a line C-C indicated in FIG. 7A in accordance with an embodiment of the present invention.

The step S3 may include the following step: etching (e.g., using a chemical wet etching method and/or a chemical dry etching method) the gate structure material member 200' in the structure illustrated in FIGS. 6A to 6D, such that the structure illustrated in FIGS. 7A to 7D may be formed. As can be appreciated from FIGS. 7A to 7D, one or more portions of the gate structure 200 may be disposed inside one or more recesses 101. A bottom surface of the gate structure 200 may include portions not lying in a same plan (i.e., not coplanar) and may be positioned between the substrate 100 and a top surface of the gate structure 200. The total area of the bottom surface of the gate structure 200 may be substantially larger than the total area of the top surface of the gate structure 200.

FIG. 8A shows schematic plan view (or top view) illustrating a transistor device (e.g., including the gate structure 200 illustrated in FIGS. 7A to 7D) in accordance with an embodiment of the present invention. FIG. 8B shows a schematic cross-sectional view taken at a line A-A indicated in FIG. 8A in accordance with an embodiment of the present invention. FIG. 8C shows a schematic cross-sectional view taken at a line B-B indicated in FIG. 8A in accordance with an embodiment of the present invention. FIG. 8D shows a schematic cross-sectional view taken at a line C-C indicated in FIG. 8A in accordance with an embodiment of the present invention.

In addition to the steps S1, S2, and S3, a method for manufacturing a transistor device may further include the following steps: forming sidewalls 400 on lateral sides of the gate structure illustrated in FIGS. 7A to 7D; providing (e.g., injecting) a conductive material (using the gate structure 200 and the sidewalls 400 as masks) in the active region defined by the STI structure 300 to form a source 500 and a drain 600, such that the transistor device illustrated in FIGS. 8A to 8D may be formed.

For preventing generation of excessive overcurrent between the source 500 or drain 600 and the gate structure 200, which may undesirably cause current increase in the transistor device, a length of the gate structure 200 in the channel length direction L may be less than or equal to the first length of a recess 101 (and/or the first length of a second opening of the second photoresist 702) in the channel length direction L. One or more portions of the source 500 and one or more portions of the drain 600 may be positioned inside one or more recesses 101.

According to embodiments of the invention, in a transistor device, a gate structure 200 may be partially disposed inside one or more recesses 101, such that sides of the one or more recesses 101 may practically maximize an effective channel width of the transistor device. Advantageously, an on-state resistance (Ron) of the transistor device may be minimized, and performance of the transistor device may be optimized.

According to embodiments of the invention, the one or more recesses 101 may not substantially complicate the structure or manufacturing of the transistor device, and the one or more recesses 101 may not cause significant undesirable effects on the performance of the transistor device. Advantageously, the transistor device may have satisfactory performance characteristics without incurring an undesirably high cost or significant side effects.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A transistor device comprising:
   a substrate that has a first recess and a first substrate surface, wherein the first recess is recessed with respect to the first substrate surface;
   a source that overlaps the substrate;
   a drain overlaps the substrate; and
   a gate structure that has a first gate structure portion and a second gate structure portion, wherein the first gate structure portion is positioned inside the first recess, wherein the second gate structure portion is connected to the first gate structure and is positioned outside the first recess, wherein a portion of the source and a portion of the drain extend underneath the first gate structure portion.

2. The transistor device of claim 1, wherein the second gate structure portion overlaps the first substrate surface.

3. The transistor device of claim 1, wherein the first recess has a first length in a first direction from the source to the drain, wherein the first recess has a second length in a second direction that is perpendicular to the first direction, and wherein the first length is larger than the second length.

4. The transistor device of claim 3, wherein a length of the gate structure in the first direction is less than or equal to the first length.

5. The transistor device of claim 1, wherein the substrate further has a second recess that is recessed with respect to the first substrate surface, wherein the gate structure further has a third gate structure portion that is positioned inside the second recess, wherein the first substrate surface is positioned between the first recess and the second recess in a plan view of the transistor device in a direction perpendicular to a distance direction that corresponds to a distance between the source and the drain.

6. The transistor device of claim 1, wherein a depth of the first recess with respect to the first substrate surface is in a range of 10% to 50% of a thickness of the substrate with respect to the first substrate surface.

7. The transistor device of claim 1, wherein the gate structure includes an oxide member and a polysilicon member, wherein the polysilicon member includes a polysilicon portion that is positioned inside the first recess, and wherein the oxide member is positioned between the substrate and the polysilicon member.

8. The transistor device of claim 7, wherein the oxide member has a first oxide portion and a second oxide portion, wherein the first oxide portion extends not coplanar with the second oxide portion, and wherein both the first oxide portion and the second oxide portion are positioned inside the first recess and contact the polysilicon portion.

9. The transistor device of claim 1, further comprising: an isolation member formed of an insulating material, wherein the substrate further has a trench, wherein the isolation member is positioned inside the trench, and wherein the first recess is positioned between two portions of the isolation member in a cross-sectional view of the transistor device.

10. The transistor device of claim 1, wherein a portion of the source and a portion of the drain are positioned inside the first recess.

* * * * *